United States Patent [19]
Müller et al.

[11] Patent Number: 4,587,490
[45] Date of Patent: May 6, 1986

[54] ELECTROMAGNET FOR NMR TOMOGRAPHY

[75] Inventors: Wolfgang Müller, Karlsruhe; Bertold Knüttel; Günther Laukien, both of Rheinstetten, all of Fed. Rep. of Germany

[73] Assignee: Bruker Analytische Messtechnik GmbH, Rheinstetten-Forchheim, Fed. Rep. of Germany

[21] Appl. No.: 559,869

[22] Filed: Dec. 8, 1983

[30] Foreign Application Priority Data

Dec. 11, 1982 [DE] Fed. Rep. of Germany ....... 3245944

[51] Int. Cl.⁴ ............................................. G01R 33/20
[52] U.S. Cl. ...................................... 324/320; 324/319
[58] Field of Search ............... 324/300, 307, 309, 313, 324/314, 318, 319, 320, 322

[56] References Cited
U.S. PATENT DOCUMENTS
4,490,675 12/1984 Knuettel .............................. 324/319

FOREIGN PATENT DOCUMENTS
2027208 2/1980 United Kingdom .

Primary Examiner—Michael J. Tokar
Attorney, Agent, or Firm—Burmeister, York, Palmatier, Hamby & Jones

[57] ABSTRACT

An electromagnet for producing the constant magnetic field required in NMR tomography comprises a coil system (1, 2, 3, 4) of the Helmholtz double coil type. The coil system is enclosed in, and supported by, a stable cylindrical shell (5). The influence exerted by the cylindrical shell (5) on the homogeneity of the magnetic field, which is generated by the coil system in an accessible interior space defined by it and suitable to receive the body to be examined, is compensated by the particular dimensioning of the field and error coils (1, 2, 3, 4). The cylindrical shell (5) is best made of a ferromagnetic material having low electric conductivity and is constructed of a plurality of axially serially disposed annular discs (6) which are preferably divided into sectors.

10 Claims, 2 Drawing Figures

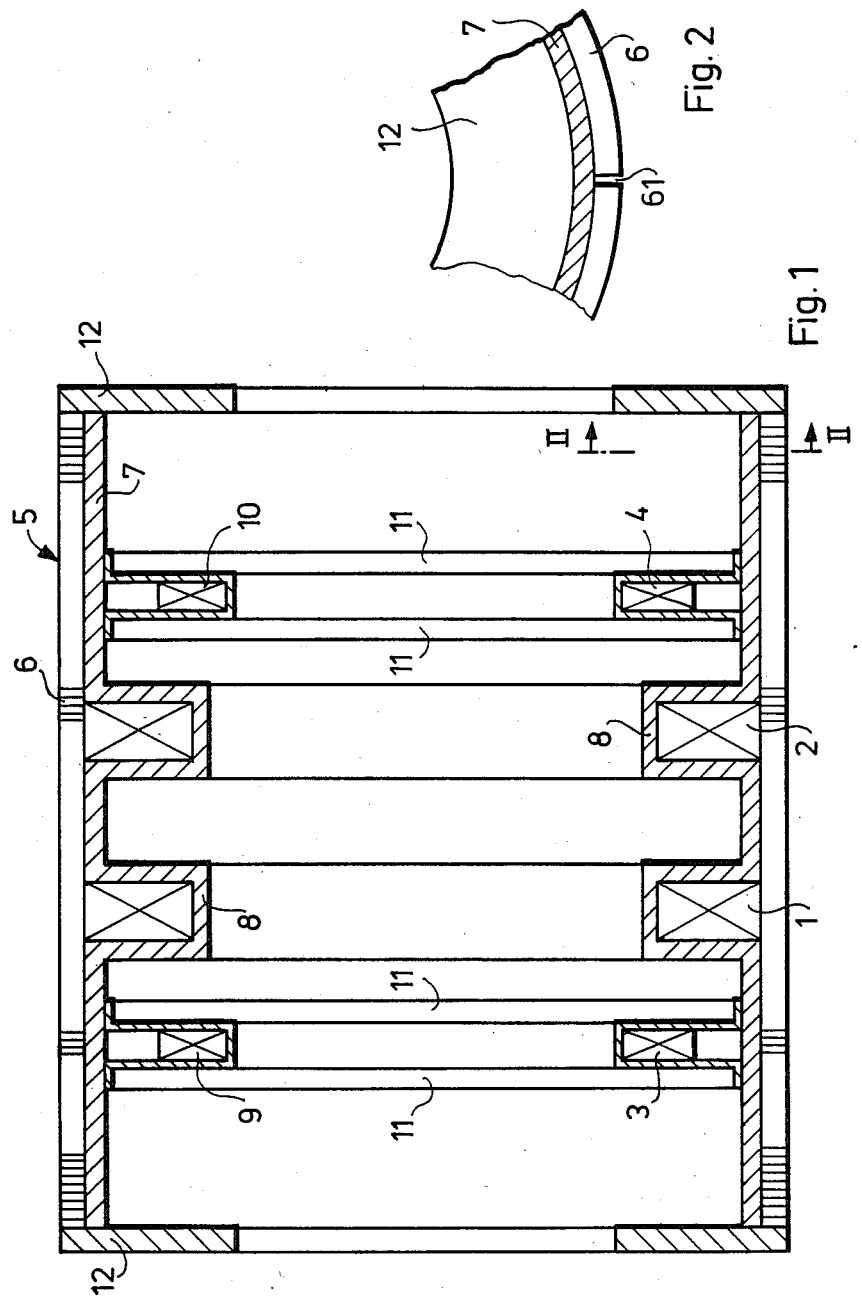

ELECTROMAGNET FOR NMR TOMOGRAPHY

FIELD OF THE INVENTION

This invention relates to an electromagnet for generating the constant magnetic field required in NMR tomography.

BACKGROUND OF THE INVENTION

The electromagnet includes a coil assembly consisting of at least one circular cylindrical field coil and at least one correction coil concentric with the field coil. The coil assembly is enclosed in, and simultaneously supported by, a stable cylindrical shell made of iron whose influence on the homogeneity of the magnetic field, which is produced by the coil system in an interior space defined by it and is suitable and accessible to accommodate an organic body to be examined, is compensated by the particular dimensioning of the field and correction coils, as it is described in U.S. patent application Ser. No. 386,981, filed June 10, 1982 now U.S. Pat. No. 4,490,675, issued Dec. 25, 1984.

The electromagnet disclosed in the aforementioned patent application is constructed essentially in the form of a long solenoid either of the single piece type or made up of a plurality of composite parts. Secured to the ends of the solenoid are correction or error coils. It is thus possible to produce coil systems which have an especially small diameter while being of considerable length and which are therefore particularly well suited to accommodate a human body for examination. Such coil systems are very similar to the coil systems described by Garrett in the Journal of Applied Physics, Vol. 42, No. 8 (July 1969), pages 3171-3179. However, the values given by Garrett for these coil systems must be modified to compensate for the influence exerted by the ferromagnetic cylindrical shell.

SUMMARY OF THE INVENTION

Generally speaking, however, the basic concept of the invention forming the subject matter of the aforementioned earlier patent application is applicable to advantage to any coil system, including particularly the so called Helmholtz double coils, which are well known to those skilled in the art. The advantages of shielding the coil assembly and the resulting improved uniformity of the magnetic field, coupled with a decrease in power requirements, as set forth in the aforementioned patent application, are realized also in conjunction with other coil systems.

It is therefore the object of the present invention to construct the coil system for an electromagnet of the type referred to in the foregoing in the form of a Helmholtz double coil system.

As has been discussed in the aforementioned patent application, in tomographic examinations it is necessary to produce relatively strong gradient fields that are capable of being quickly turned on and off. This shifting of the gradient fields tends to give rise to eddy currents in the ferromagnetic cylindrical shell. These currents can be kept small by providing one or a plurality of slots in the cylindrical shell along its axial direction, e.g. laminating the cylindrical shell, so that the occurrence of closed currents along the circumference of the cylindrical shell is prevented. However, eddy currents may also occur that flow in the longitudinal direction of the cylindrical shell. In order to hold down also such currents, the cylindrical shell may be divided, or laminated, in at least one plane perpendicular to its axis. It has been found particularly advantageous to construct the cylindrical shell of a plurality of annular discs serially disposed in the axial direction. While in this particular construction the occurrence of air gaps in the magnetic circle of the coil system generating the constant magnetic field can not be entirely avoided, resulting in a decreased permeability of the cylindrical shell, any potential adverse effects can be obviated by an appropriate dimensioning of the annular discs. It will be appreciated that the annular discs have at least one marginal slot, or may be divided into sectors, to produce longitudinal slots which will prevent the occurrence of closed currents flowing in the circumferential direction of the cylindrical shell, as discussed in the aforementioned patent application.

With respect to the suppression of eddy currents, it is advantageous that the cylindrical shell be made of a ferromagnetic material having low electric conductivity.

The invention will be described in the following with reference to one embodiment illustrated in the drawing.

The particular features shown in the drawing and discussed in the specification by way of example may also be applied to other embodiments of the invention, either individually or in any desired combination.

BRIEF DESCRIPTION OF THE DRAWINGS

FIG. 1 shows a longitudinal sectional view of an electromagnet according to the invention;

FIG. 2 shows a partial section through the electromagnet of FIG. 1 along line II—II.

DETAILED DESCRIPTION OF ILLUSTRATIVE EMBODIMENTS

Referring to the drawing, the electromagnet comprises two axially spaced inner coils 1 and 2 and two outer coils 3 and 4 axially symmetrically spaced from the inner coils. The diameter of the outer coils 3 and 4 is smaller than the diameter of the inner coils 1 and 2. All of the coils are coaxially aligned and thus form essentially a so called Helmholtz double coil system. The coils 1 and 4 are enclosed in a cylindrical shell 5 of soft iron or other ferromagnetic material which is constituted by individual ring-shaped or annular discs 6. The annular discs may be provided with radial slots 61, or they may also be divided into sectors. Since these are structural details that are conventional, they will not need to be discussed in further detail herein. The inner coils 1 and 2 are wound upon a generally cylindrical tubular core 7 which extends the entire length of the cylindrical shell 5 and bears against the inner surface of the cylindrical shell 5. The core 7 has chambers or sections 8 in the form of U-shaped annular channels for housing the two inner coils 1 and 2. The outer coils 3 and 4 are wound upon separate cores 9 and 10, respectively, which are substantially U-shaped in cross section, with the annular cavity or channel opening outwardly. Flanges 11 are provided at the ends of the legs of the U-shaped cores by means of which the cores 9 and 10 are secured to the inner side of the core 7 carrying the inner coils 1 and 2. The cylindrical shell 5 extends past the outer coils 3 and 4 and is provided at its ends with ring-shaped plates 12, likewise made of iron or other ferromagnetic material. The dimensions of the magnet depend on the size of the object examined and, consequently, on the size of the area in which the magnetic field developed by the electromagnet must have a sufficient homogeneity.

It will be seen from FIG. 1 that the inner coils 1 and 2 constitute a first pair of Helmholtz double coils, while the outer coils 3 and 4 constitute a second pair of Helmholtz double coils. Each of the inner coils 1 and 2 is relatively narrow in its axial width, while the axial spacing or separation between the coils, center to center, is relatively great. Thus, the axial width of each of the coils 1 and 2 is substantially smaller than the axial spacing therebetween, center to center. The axial width is only a minor fraction of the axial spacing. Each of the coils 1 and 2 has a relatively great radius, measured from the axis of the coil. Thus, the axial width of each of the coils 1 and 2 is substantially less than the radius of the coils and is only a minor fraction of such radius.

These dimensional relationships also apply to the outer pair of coils 3 and 4, constituting the second pair of Helmholtz double coils. The axial width of each of the coils 3 and 4 is substantially smaller than the axial spacing therebetween, center to center, and is only a minor fraction of such spacing. The axial width of each of the coils 3 and 4 is substantially less than the radius of the coils and is only a minor fraction of such radius.

The radius of the inner coils 1 and 2 is substantially greater than the radius of the outer coils 3 and 4. The axial width of each of the inner coils 1 and 2 is substantially less than the axial width of each of the outer coils 3 and 4. The axial spacing, center to center, between the inner coils 1 and 2 is substantially less than the axial spacing, center to center, between the outer coils 3 and 4.

The ferromagnetic cylindrical shell 5 acts as an outer boundary wall enclosing each of the U-shaped channels 8 in which the inner coils 1 and 2 are housed. The inner coils 1 and 2 fully occupy such channels 8 and are confined therein by the ferromagnetic cylindrical shell 5.

In the electromagnet of the present invention, the cylindrical iron shell 5, in conjunction with the magnet cores 7 and 9, ensures an extremely safe and accurately centered mounting of the coils 1 to 4 and this can be maintained also at temperature fluctuations and concomitant dimensional changes. Of significance again is that the system is completely symmetric. The recursion of the external magnetic field through the cylindrical iron shell 5 and the ring-shaped plates 12 results in a considerable lowering of the energy requirements which is important as to both operating costs and stability of the electromagnet. The iron shell including the ring-shaped plates 17 promotes the production of a homogeneous magnetic field having a homogeneous area of large magnitude. Furthermore, the very thick-walled iron shell 5 affords outstanding shielding against external magnetic fields and external electromagnetic interfering radiation, as well as protection against radiation from the high frequency field generated in NMR tomography inside the shield. This effect is in no way diminished by the lamination of the cylindrical shell 5. Rather, by preventing the rise of eddy currents, which may occur in NMR tomography because of the rapid shifting of strong gradient fields, the thermal load on the cylindrical shell 5 is significantly reduced and this is beneficial to the stability of the entire magnet. For the construction of the cylindrical shell, the choice of a material is of advantage which has a high permeability coupled with a relatively low electric conductivity.

Such materials are for example alloys of hyperpure iron and 1 to 4% silicon, and similiar iron alloys as used for laminated transformer cores (see S. Cedighian "Die magnetischen Werkstoffe", VDI Verlag 1967, page 201, FIG. 6.11)

It will be appreciated that the invention is not limited to the embodiment illustrated and described by way of example, but that many configurations are feasible, in particular also including the variations disclosed in the aforementioned earlier patent application in which the coil assemblies utilized may be replaced by Helmholtz double coil systems.

We claim:

1. An electromagnet for producing a constant magnetic field as required for use in NMR tomography of a body to be examined, the electromagnet comprising a generally cylindrical ferromagnetic shell, and a coil system mounted and supported within the ferromagnetic shell for producing a substantially homogeneous magnetic field within the coil system, such coil system having an axial interior space therein for receiving the body to be examined in such substantially homogeneous magnetic field, such coil system including an inner pair of Helmholtz double coils, means for securely supporting the inner pair of Helmholtz double coils within the ferromagnetic shell, each of said coils having an axial width dimension, said coils having a radial dimension and an axial spacing dimension center to center therebetween, the axial width dimension being substantially smaller than the axial spacing dimension, the axial width dimension also being substantially smaller than the radial dimension, the coil system including a second, outer pair of Helmholtz double coils having an axial spacing dimension center to center therebetween substantially greater than the axial spacing dimension of the inner pair of Helmholtz double coils, means securely supporting the outer pair of Helmholtz double coils within the ferromagnetic shell, such coils of the outer pair having an axial width dimension substantially smaller than the axial spacing dimension between such coils and also substantially smaller than the radius of such coils.

2. An electromagnet according to claim 1, in which the ferromagnetic shell is laminated in at least one plane perpendicular to the axis of the shell to interrupt eddy current flow.

3. An electromagnet according to claim 1, in which the ferromagnetic shell is constructed of a series of laminations in the form of annular discs coaxial with the shell to interrupt eddy current flow.

4. An electromagnet according to claim 3, in which the annular discs have at least one marginal slot to reduce eddy current flow.

5. An electromagnet according to claim 1, in which the ferromagnetic shell is made of a ferromagnetic material having low electrical conductivity to reduce eddy current flow.

6. An electromagnet for producing a constant magnetic field as required for use in NMR tomography of a body to be examined, the electromagnet comprising a generally cylindrical ferromagnetic shell, and a coil system mounted and supported within the ferromagnetic shell for producing a substantially homogeneous magnetic field within the coil system, such coil system having an axial interior space therein for receiving the body to be examined in such substantially homogeneous magnetic field, such coil system including an inner pair of Helmholtz double coils, means including a generally cylindrical tubular core for securely supporting the inner pair of Helmholtz double coils within the ferromagnetic shell, such core being received within and bearing against the inner surface of the ferromagnetic shell, such core having a pair of U-shaped annular channels for receiving and housing the inner pair of Helmholtz double coils, each of said coils having an axial width dimension, said coils having a radial dimension and an axial spacing dimension center to center therebetween, the axial width dimension being substantially smaller than the axial spacing dimension, the axial width dimension also being substantially smaller than the radial dimension, the coil system including a second, outer pair of Helmholtz double coils having an axial spacing dimension center to center therebetween substantially greater than the axial spacing dimension of the inner pair of Helmholtz double coils, means including a pair of U-shaped annular core members for receiving and securely supporting the outer pair of Helmholtz double coils within the ferromagnetic shell, such coils of the outer pair having an axial width dimension substantially smaller than the axial spacing dimension between such coils and also substantially smaller than the radius of such coils, the ferromagnetic shell affording a magnetic return path and a magnetic shield for such coil system while also affording stable support for the coil system.

7. An electromagnet according to claim 6,
in which the generally cylindrical ferromagnetic shell constitutes an outer boundary wall enclosing such U-shaped annular channels.

8. An electromagnet according to claim 7,
in which the inner pair of Helmholtz double coils fully occupy the U-shaped annular channels and are confined therein by the ferromagnetic shell.

9. An electromagnet according to claim 6,
in which said U-shaped annular core members are securely mounted within said generally cylindrical tubular core.

10. An electromagnet according to claim 6,
in which the ferromagnetic shell is constructed of a series of laminations in the form of annular discs coaxial with the shell to interrupt eddy current flow.

* * * * *